(12) United States Patent
Carley

(10) Patent No.: US 11,385,423 B2
(45) Date of Patent: Jul. 12, 2022

(54) OPTO-ELECTRONIC ASSEMBLY HAVING MECHANICAL SUPPORT FOR FLEXIBLE PCB FROM LENS-HOLDING COVER

(71) Applicant: Hilight Semiconductor Limited, Southampton (GB)

(72) Inventor: Carl Carley, Basingstoke (GB)

(73) Assignee: HILIGHT SEMICONDUCTOR LIMITED, Hampshire (GB)

( * ) Notice: Subject to any disclaimer, the term of this patent is extended or adjusted under 35 U.S.C. 154(b) by 85 days.

(21) Appl. No.: 17/064,481

(22) Filed: Oct. 6, 2020

(65) Prior Publication Data
US 2021/0103109 A1  Apr. 8, 2021

(51) Int. Cl.
G02B 6/42    (2006.01)
H05K 1/11    (2006.01)
H05K 1/18    (2006.01)

(52) U.S. Cl.
CPC .......... G02B 6/4281 (2013.01); G02B 6/426 (2013.01); H05K 1/115 (2013.01); H05K 1/189 (2013.01); H05K 2201/10121 (2013.01); H05K 2201/10287 (2013.01)

(58) Field of Classification Search
CPC ...... G02B 6/4281; G02B 6/426; G02B 6/423; G02B 6/424; G02B 6/4204; G02B 6/24; G02B 6/4201; H05K 1/115; H05K 1/189; H05K 2201/10121; H05K 2201/10287; H04B 10/60
See application file for complete search history.

(56) References Cited

U.S. PATENT DOCUMENTS

| | | | |
|---|---|---|---|
| 5,610,395 A | 3/1997 | Nishiyama | |
| 2004/0105627 A1 | 6/2004 | Hargis et al. | |
| 2005/0062117 A1 | 3/2005 | Gallup et al. | |
| 2005/0121736 A1 | 6/2005 | Wang et al. | |
| 2021/0103109 A1* | 4/2021 | Carley | G02B 6/426 |
| 2021/0297162 A1* | 9/2021 | Carley | H04B 10/69 |

FOREIGN PATENT DOCUMENTS

| | | |
|---|---|---|
| CN | 108957649 A | 12/2018 |
| GB | 2575205 A | 1/2020 |

OTHER PUBLICATIONS

Combined Search and Examination Report under Sections 17 and 18(3) for United Kingdom Application No. GB1914525.9, dated Nov. 20, 2019, 5 pages.

* cited by examiner

Primary Examiner — Andrew Jordan
(74) Attorney, Agent, or Firm — Squire Patton Boggs (US) LLP

(57) ABSTRACT

An assembly of electronic components enabling reception of data using an optical fiber includes: a photodiode; an amplifier coupled to the photodiode; a flexible printed circuit board, the photodiode and amplifier physically mounted on the flexible printed circuit board; a cover, the cover configured to cover the photodiode and the amplifier, wherein the cover is physically attached to the printed circuit board so as to provide mechanical rigidity around the photodiode, and the cover having an optically transparent aperture containing a lens configured to focus modulated light signals from a fiber onto the photodiode; and conductive bond wires configured to directly electrically couple the amplifier and the photodiode to conducting traces of the flexible printed circuit board.

20 Claims, 8 Drawing Sheets

OPTO-ELECTRONIC ASSEMBLY HAVING MECHANICAL SUPPORT FOR FLEXIBLE PCB FROM LENS-HOLDING COVER

CROSS-REFERENCE TO RELATED APPLICATIONS

This application claims priority to, and the benefit of, Great Britain Application No. 1914525.9, filed on Oct. 8, 2019, the entire contents of which are incorporated herein by reference in its entirety for all purposes.

FIELD OF THE INVENTION

The present application relates to opto-electronic assemblies and receive optical sub-assembly construction with chip-on-flex through-hold bonding.

BACKGROUND OF THE INVENTION

High speed optical communication links comprise many optical, electronic and opto-electronic components and assemblies wherein electrical signals are converted into optical signals for transmission over a fibre; and where optical signals conveyed by means of a fibre are converted to an electrical signal and subject to amplification and further processing. Common requirements for the components and assemblies used in such links are that the cost be minimised, while at the same time the performance is to be maximised.

This invention is concerned with that part of an optical communications system wherein an optical signal is received and converted into an electrical signal and subject to amplification and possibly also subject to other signal processing functions before being conveyed to other components of the complete signal chain. The receive functions in one sub-assembly may in some cases be combined with transmit functions contained in another sub-assembly into a larger assembly. The features of the invention to be described are applicable for an assembly intended for the receive path of an optical communications system or for use in a combined assembly for both receive and transmit paths, and where the description refers to a receive function, it should be taken that the features may also be used in a combined assembly.

Such a receive path component is commonly called a Receive Optical Sub-Assembly or ROSA, and may comprise a photodiode and an associated amplifier, typically a transimpedance amplifier, possibly with an associated internal limiting amplifier. The associated amplifier is typically mounted close to the photodiode in order to maximise the bandwidth of the complete system. Conventionally the photodiode and the amplifier are mounted in a metal can wherein the external electrical connections are provided by means of wire leads that feed through insulating regions in the base of the can and wherein said leads further provide posts within the can to which wires may be bonded. These wires may also be bonded to pads on the amplifier integrated circuit and also on to pads on the photodiode. By these means power, monitoring, control and signal paths are established. The wire leads from the can are then connected to a flexible printed circuit board and this flexible board is further connected to the main electrical functions of a receiver module.

Such metal cans represent a significant proportion of the total cost of the ROSA.

Further, there is an inherent impediment to achieving the highest possible operating bandwidth since it is necessary for the high data rate output signals from the amplifier to pass in turn through bond wires, header posts, lead wires and then via conductive traces in a flexible PCB before being communicated to the next electronic functions in the signal chain.

SUMMARY OF THE INVENTION

It is an object of the invention to provide means of construction and configuration for the receiving function of a high speed optical communication system wherein manufacturing cost is reduced compared with prior art. It is a further object of the invention to provide a construction and configuration for the receiving function of a high speed optical communication system wherein improved performance can be achieved compared with prior art.

A benefit of the invention is that any requirement to use an expensive fully enclosed metal can for the mounting of the photodiode and the associated amplifier is avoided by mounting the core electronic components directly on the flexible PCB and where local mechanical stiffness is then provided by the lens mounting can.

A further benefit is that the electrical output signals from the amplifier are communicated to the next electronic functions in the signal chain more directly without going through separate leads fixed in a metal can, but instead by firstly a bond wire and then a trace on a flexible printed circuit board, reducing the impedance variations and discontinuities in the signal path and thereby improving high speed signal performance.

According to a first aspect of the invention there is provided an assembly of electronic components providing means for the reception of data using an optical fibre wherein said assembly comprises: a photodiode; an amplifier coupled to said photodiode; a flexible printed circuit board, said photodiode and amplifier physically mounted on said flexible printed circuit board; a cover, said cover configured to cover said photodiode and said amplifier, wherein said cover is physically attached to said flexible printed circuit board so as to provide mechanical rigidity around said photodiode and said amplifier, and said cover having an optically transparent aperture containing a lens configured to focus modulated light signals from a fibre onto said photodiode; and conductive bond wires configured to directly electrically couple said amplifier and said photodiode to conducting traces of said flexible printed circuit board.

The assembly may further comprise ancillary electronic components mounted on said flexible printed circuit board and covered by said cover.

The cover may comprise one of: a metal can structure; and a plastic can structure.

The conducting traces of said flexible printed circuit board may be located on a side opposite to a side of said flexible printed circuit board on which said photodiode and said amplifier are physically mounted.

The flexible printed circuit board may be configured to have at least one hole from one side of said flexible printed circuit board to an opposite side of said board, said at least one hole being located within a region of said flexible printed circuit board covered by said cover.

The connections between said conductive traces and said photodiode and said amplifier may comprise at least one plated through hole and bonding contact areas within said cover.

The conductive traces may be laid out in a manner that minimises impedance variations and discontinuities in an electrical path between said electronic components and an edge of said flexible printed circuit board.

The cover may be attached to said printed circuit board by means of one of: a fixing agent; and an adhesive; and solder.

The regions of said conductive traces located under said at least one hole used for providing connection between said traces and said photodiode and said amplifier may have a larger diameter than said at least one hole.

The regions of said conductive traces located under said at least one hole used for providing connection between said traces and said photodiode and said amplifier may be made sufficiently large as to provide mechanical support for said traces in said region of said holes.

A precious metal layer may be used to coat areas inside said cover to which bonding wires may be attached to make electrical signal and power connections.

The said holes provided to allow connection between said conductive traces and said amplifier and said photodiode within said covering may be cut using one of: a laser; and an ultraviolet laser.

According to a second aspect of the invention there is provided a method of assembly of electronic components to provide a means for reception of data using an optical fibre, wherein said method comprises: providing a flexible printed circuit board; physically mounting on said flexible printed circuit board a photodiode and an amplifier; providing on said flexible printed circuit board at least one conductive trace from an edge of said flexible printed circuit board to at least one region of said board on which said amplifier and said photodiode are mounted; providing on said flexible printed circuit board holes through said board configured to provide means of electrical connection between opposite sides of said printed circuit board; physically attaching a cover on said flexible printed circuit board and over said photodiode and said amplifier, said cover being configured to provide mechanical rigidity around said photodiode and said amplifier, and said cover having an optically transparent aperture containing a lens configured to focus modulated light signals from a fibre onto said photodiode; and coupling said amplifier and said photodiode to said conducting traces of said flexible printed circuit board.

The method may provide for a cover configured to cover ancillary electronic components on said printed circuit board.

The method may provide for a cover comprising one of: a metal can structure; a plastic can structure.

The method may provide for attaching said cover to said flexible printed circuit board by means of one of: a fixing agent; an adhesive; solder.

The method may provide for conductive traces on a side of said flexible printed circuit board wherein said photodiode and said amplifier are attached.

The method may provide for forming least one hole within the region of said flexible printed circuit board covered by said cover.

The method may provide for making connections between said conductive traces and said photodiode and said amplifier by means of at least one plated through hole and bonding contact areas within said cover.

The method may provide for forming said conductive traces in a manner that minimises impedance variations and discontinuities in an electrical path between said electronic components and an edge of said flexible printed circuit board.

The method may provide for regions of said conductive traces located under said at least one hole used for providing connection between said traces and said photodiode and said amplifier to be of larger diameter than said at least one hole.

The method may provide for regions of the conductive traces located under said at least one hole used for providing connection between said traces and said photodiode and said amplifier electronic components to be made sufficiently large as to provide mechanical support for said traces in the region of said hole.

The method may provide for at least one electrical connection between the said traces and the said amplifier and said photodiode to be made by providing at least one bond wire from a conductive trace through said at least one hole to an opposite side of said flexible printed circuit board.

The method may provide for a precious metal layer to be applied to coat areas inside said covering metal can to which bonding wires may be attached to make electrical signal and power connections.

The method may provide for the cutting of at least one hole provided to allow connection between said conductive traces and said amplifier and said photodiode within said covering can by means of one of: a laser; and an ultraviolet laser.

SUMMARY OF THE FIGURES

The method may provide for a cover configured to cover ancillary electronic components on said printed circuit board.

The method may provide for a cover comprising one of: a metal can structure; a plastic can structure.

The method may provide for a flexible printed circuit board.

The method may provide for attaching said cover to said printed circuit board by means of one of: a fixing agent; an adhesive; solder.

The method may provide for conductive traces on a side of said printed circuit board wherein said photodiode is attached.

The method may provide for forming least one hole within the region of said printed circuit board covered by said cover.

The method may provide for making connections between said conductive traces and said photodiode and said amplifier by means of at least one plated through hole and bonding contact areas within said cover.

The method may provide for forming said conductive traces in a manner that minimises impedance variations and discontinuities in an electrical path between said electronic components and an edge of said printed circuit board.

The method may provide for regions of said conductive traces located under said at least one hole used for providing connection between said traces and said photodiode and said amplifier to be of larger diameter than said at least one hole.

The method may provide for regions of the conductive traces located under said at least one hole used for providing connection between said traces and said photodiode and said amplifier electronic components to be made sufficiently large as to provide mechanical support for said traces in the region of said hole.

The method may provide for at least one electrical connection between the said traces and the said amplifier and said photodiode to be made by providing at least one bond wire from a conductive trace through said at least one hole to an opposite side of said printed circuit board.

The method may provide for a precious metal layer to be applied to coat areas inside said covering metal can to which bonding wires may be attached to make electrical signal and power connections.

The method may provide for the cutting of at least one hole provided to allow connection between said conductive traces and said amplifier and said photodiode within said covering can by means of one of: a laser; and an ultraviolet laser.

SUMMARY OF THE FIGURES

Figure 1:
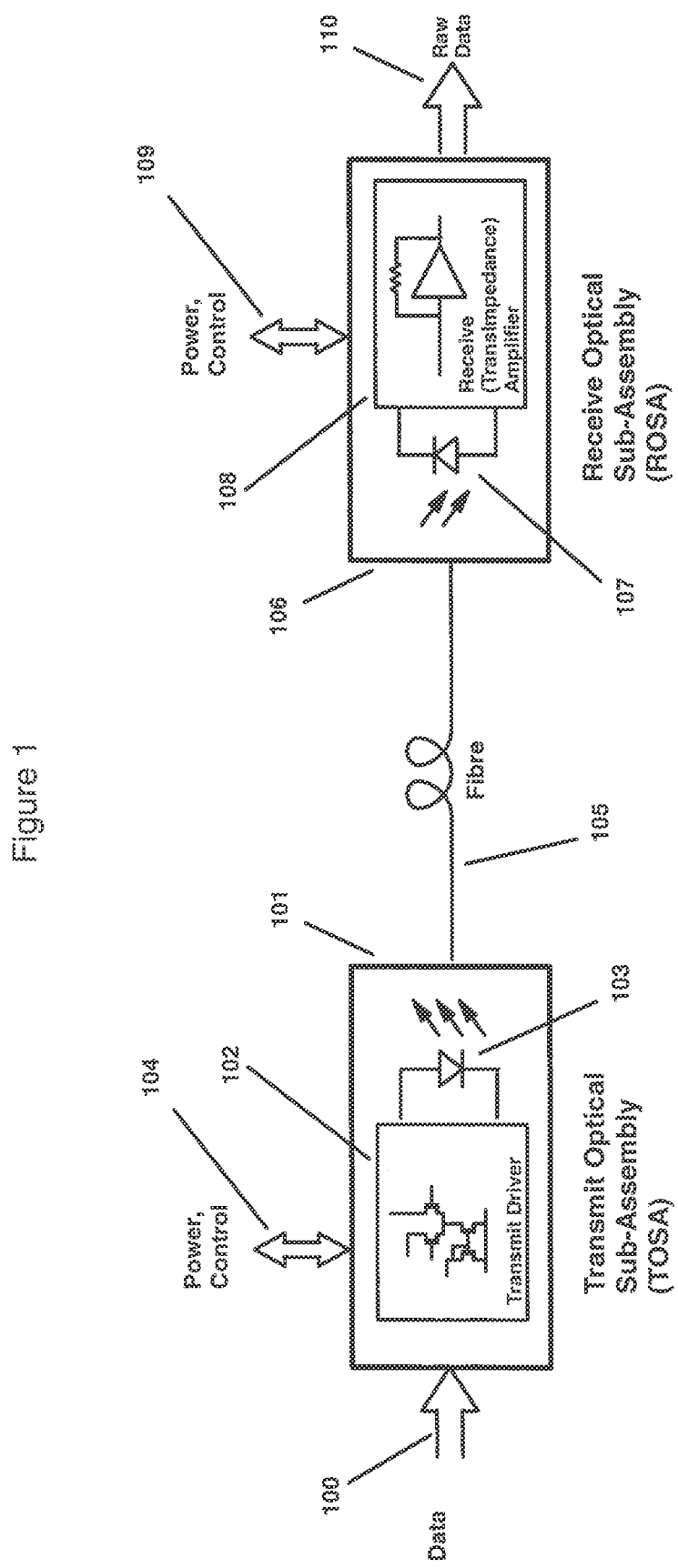

The invention will now be described solely by way of example and with reference to the accompanying drawings, in which:

FIG. 1 shows a fibre optical communications system according to prior art.

Figure 2:
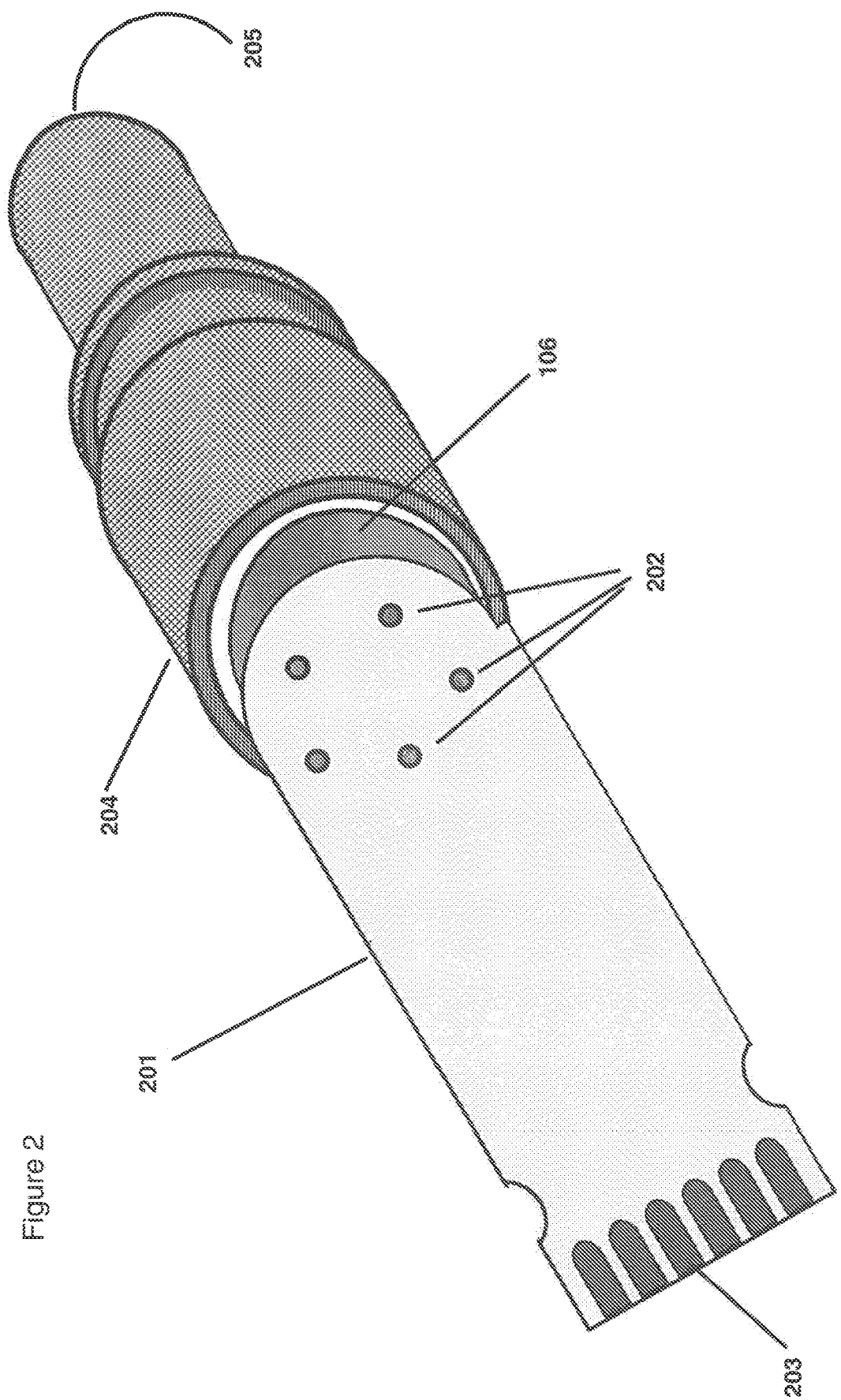

FIG. 2 shows a view of a ROSA mounted on a flexible PCB for use in a fibre optical communications receiver according to prior art.

Figure 3:
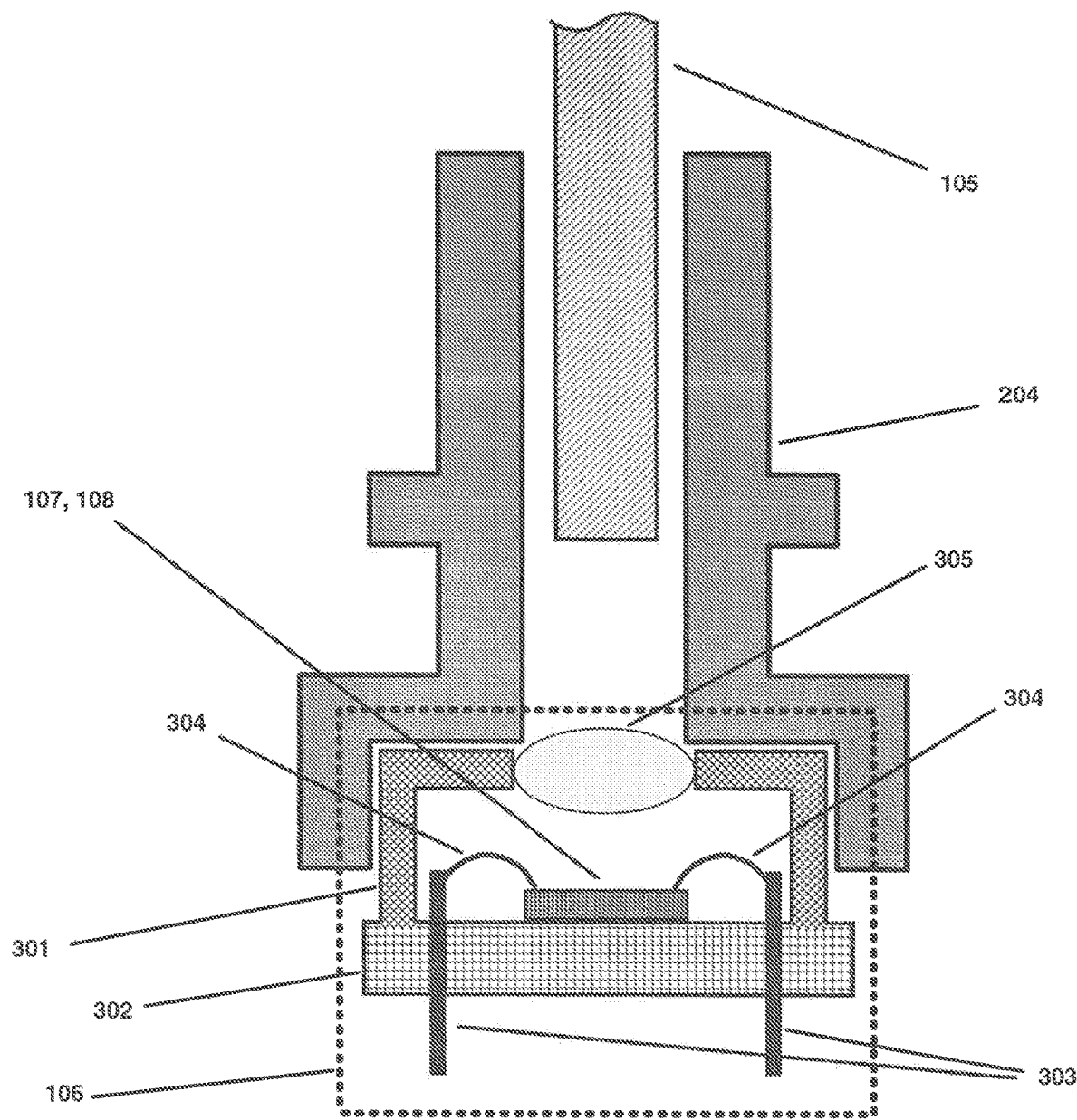

FIG. 3 shows a further view of a ROSA and the associated fibre connection for use in a fibre optical communications receiver module according to prior art.

Figure 4:
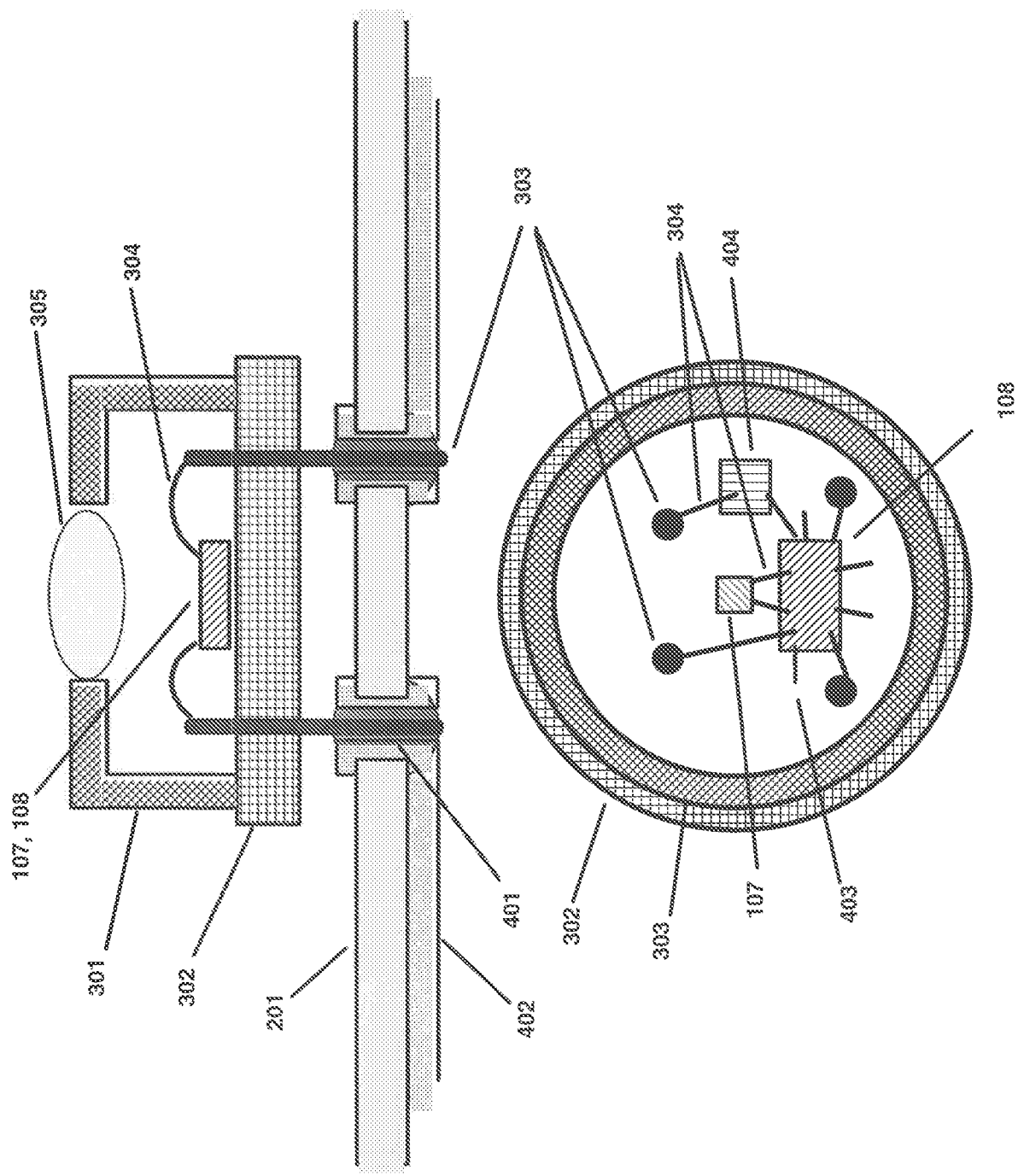

FIG. 4 shows cross sectional and top views of a ROSA according to prior art.

Figure 5:
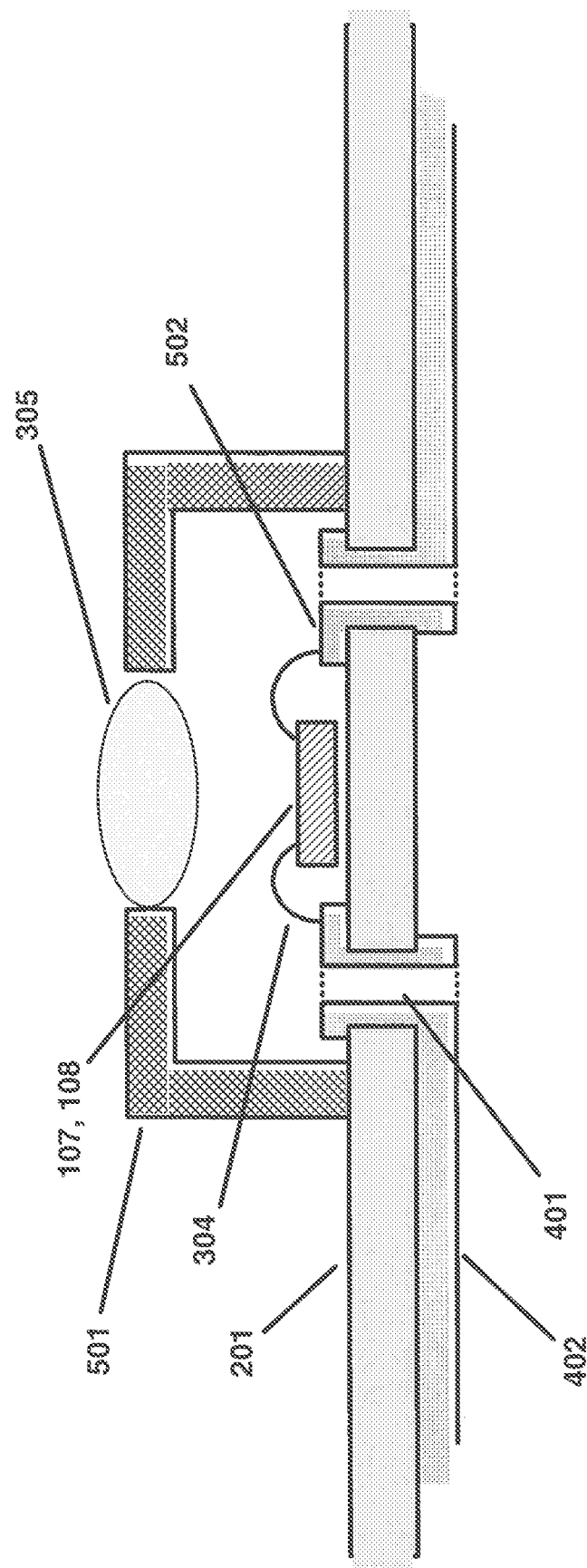

FIG. 5 shows an assembly of components for part of a fibre optical receiver configured according to an embodiment of the present invention.

Figure 6:
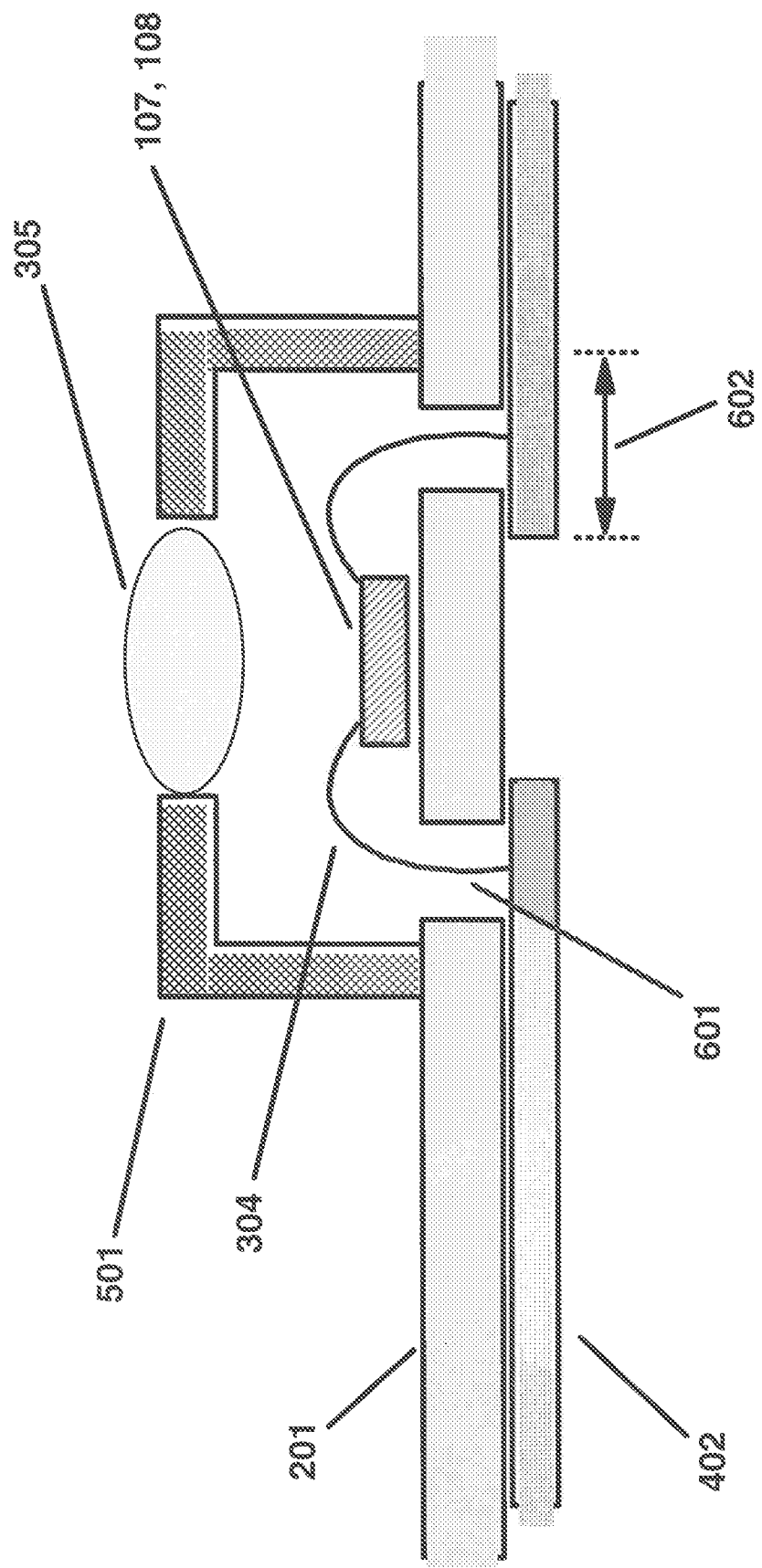

FIG. 6 shows a further assembly of components for part of a fibre optical receiver configured according to an embodiment of the present invention.

Figure 7:
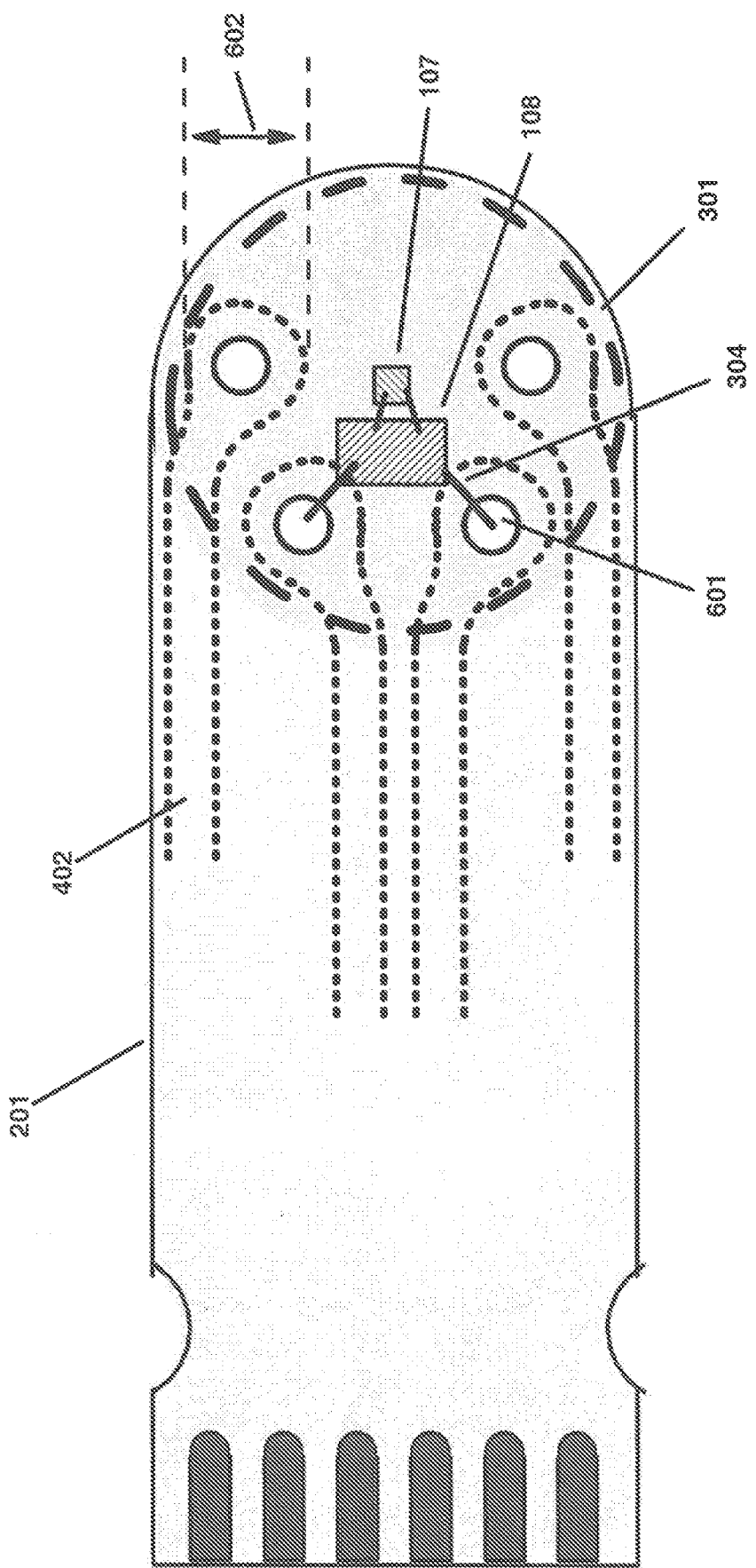

FIG. 7 shows a further assembly of components for part of a fibre optical receiver configured according to an embodiment of the present invention.

Figure 8:
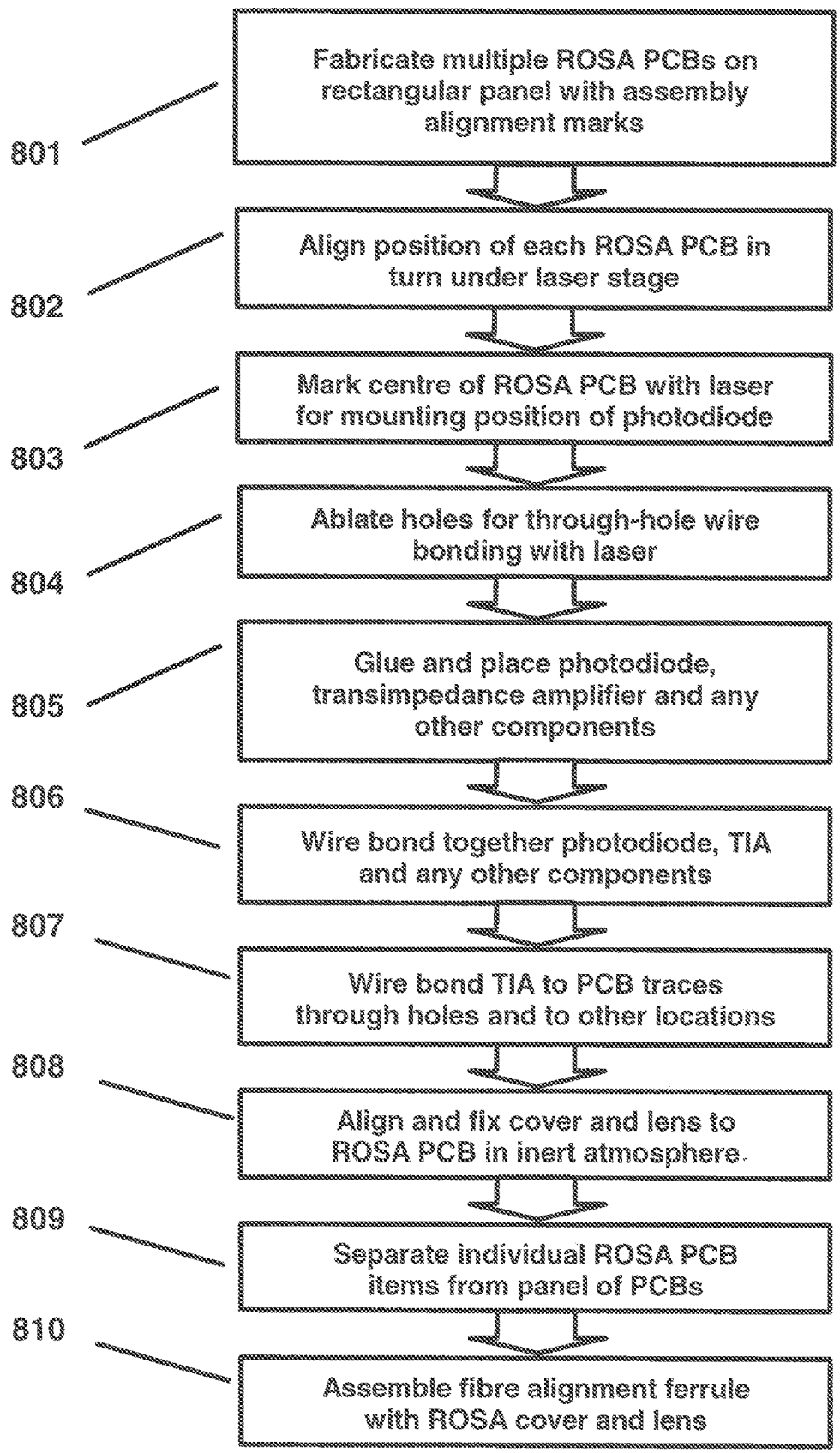

FIG. 8 shows a procedure for the method of assembly of components according to some aspects of the invention.

The description is not to be taken in a limiting sense but is made merely for the purposes of describing the general principles of the embodiments of the invention.

EMBODIMENTS OF THE APPLICATION

FIG. 1 shows the basic system level configuration of a generic optical communications physical link, wherein electrical data signals 100 containing information are converted to optical signals in a Transmit Optical Sub-Assembly (TOSA) 101, where said TOSA may be comprised of driver electronics 102 and typically a laser diode 103 or other electro-optical conversion device. The driver electronics provide the laser diode (or alternative device) with appropriate current waveforms necessary to create the desired optical signal representing the electrical data signals. There may be constraints imposed in order to respect further requirements imposed by agreed performance standards and specifications. The driver electronics may be a combination of components or have nearly all the necessary functions integrated in a single integrated circuit (IC). The TOSA will also have additional connections 104 to provide power supplies and may have control and monitoring inputs and outputs.

After travelling along the fibre 105, the optical signal is converted back to an electrical signal representing the data in a Receive Optical Sub-Assembly (ROSA) 106: Said ROSA may comprise a photodiode 107 to perform the basic conversion of the optical signal into an electrical signal, where said photodiode is coupled to an amplifier 108, typically, though not exclusively, a transimpedance amplifier (TIA), in order to deliver a usefully large raw data signal 110 that may be conveyed to electronic components and systems for further processing. The amplifier 108 is typically mounted very close to the photodiode 107 in order to minimise stray capacitance and inductance effects that could have detrimental impacts on the speed of operation. The ROSA will also have additional connections 109 to provide power supplies and may have control and monitoring inputs and outputs. The output 110 of said amplifier is typically passed to a limiting amplifier wherein the magnitude of the signal is raised and compensation made for variations in the strength of the optical signal in order to make it suitable for further processing, often by digital circuits.

FIG. 2 shows a diagrammatic representation of a ROSA 106 mounted on a flexible printed circuit board (PCB) 201 where in this view represented in the figure, the aperture for the fibre 205 to provide the optical input for the ROSA is facing away. In order to allow for the alignment of the ROSA with the incoming fibre 105 and thus couple the optical signal effectively to the sensitive face of the photodiode 107 it is commonplace to mount the ROSA on a flexible printed circuit board (PCB) with wire leads from the ROSA soldered into holes in the PCB 202. Said PCB typically carries no components apart from the ROSA and is usually solely employed for coupling the signal and power connections 109, 110 from the ROSA to the host electronic system with an array of edge connections 203 typically provided at one end of the said PCB. The ROSA itself typically has an overlay tube structure, sometimes described as a ferrule 204 attached thereto that forms part of the means for connecting and aligning the fibre 105 with the photodiode 107 contained in the ROSA.

FIG. 3 shows a cross-sectional view of a typical ROSA 106 construction together with the associated components used to connect and align the fibre 105 with the photodiode 107 contained in the ROSA. The ROSA itself is typically housed within a metal can 301 similar to those used to house discrete transistors, often referred to as "TO" cans. Said cans are typically of the order of 5 mm in diameter and 3 mm in height not including the electrical leads. The base of the can 302 may be of insulating material or have insulating regions allowing conducting leads 303 to pass through to the internal cavity of the can. The photodiode 107 and (transimpedance) amplifier 108 are mounted within the can (in this figure these components are one behind the other and thus not represented individually) and electrical connections made to the leads 303 by means of bond wires 304. Said bond wires are typically gold wires of the order of one or two millimetres in length. At the top of the can there is typically an opening into which is mounted a lens 305 employed to focus the light from the fibre onto the photodiode. Note that in FIG. 3 there are spaces shown between the fibre alignment ferrule 204 and the ROSA can 301, as well as between the fibre alignment ferrule and the incoming fibre 105, but these spaces are merely to show the individual components more clearly. In a practical implementation it will be obvious to one of ordinary skill in the arts that the fibre alignment ferrule 204 will be made to be a close fit over the ROSA can 301 and similarly a close fit for the fibre 105 in order to ensure correct alignment of the fibre with the ROSA's optical aperture and lens 305.

FIG. 4 shows further views of a typical ROSA and its conventional method of mounting on the flexible PCB both in cross section and in top view. The cross sectional view (above) shows the ROSA mounted on the flexible PCB 201. The ROSA leads 303 are connected to the conductive traces 402 of the flexible PCB typically by means of soldered connection to plated-through-hole vias 401 in the PCB. These traces carry the various signals and power paths to and from the edge connector 203 on the PCB. In the top view (below) an example is given of the possible disposition of the internal components comprised within the ROSA. Mounted on the ROSA base and typically placed a the centre is the photodiode 107, which is further connected electrically to the (transimpedance) amplifier 108 by means of bond wires 304. The amplifier, typically an integrated circuit, has further bond wire connections to the header posts of the leads 303 and also typically to a grounded conducting region on the ROSA can base 403, often referred to as down-bonds. There may also be additional components housed within the ROSA can, for example, a capacitor 404 for decoupling or other purposes.

It will be apparent to one of ordinary skill in the arts that the signal path from the (transimpedance) amplifier 108 to the edge connector 203 of the flexible PCB comprises several different parts, for example, from the amplifier integrated circuit through a bond wire 304 to the ROSA lead 303, and thence to a though-hole via 401 in the PCB, and thence through a conducting trace 402 on the PCB. At each change in the physical medium of the signal path there will inevitably be some change in the characteristic impedance experienced by the signal, and various different reflection and attenuation characteristics evident. At the desired operating data rates for such optical communications, typically up to 10 s of Gbits/s, such effects can have a significantly detrimental effect on signal trans mission. A further issue is that there is a significant cost associated with the construction of the ROSA both in parts for the can and in labour, in addition to the cost of assembling the complete ROSA on to the flexible PCB.

FIG. 5 shows an exemplar arrangement for an alternative form of ROSA that seeks to improve on some of the shortcomings of the previously described prior art according to some embodiments of the invention. The ROSA cover base 302 and the metal leads 303 (as shown in FIGS. 3 and 4) are no longer required for this arrangement and the photodiode 107 and the (transimpedance) amplifier 108 have been mounted directly on the flexible PCB 201. The photodiode (transimpedance) amplifier and any associated components are now protected by a cover 501, typically though not exclusively made of metal and providing means for mounting the lens 305, and said cover is directly attached to the PCB 201 over the photodiode 107 and the amplifier 108 and provides mechanical stiffness that avoids distortion of the optical alignment and damage to the internal assembly and electrical connections. The cover 501 is placed so that the lens 305 aligns correctly with the photodiode for optimum sensitivity. In the prior art as exemplified in FIG. 4 the ROSA 106 was attached to the flexible PCB by means of the ROSA leads 303 which also provided the electrical power and signal paths. In the new arrangement shown in FIG. 5 these leads are not present and the electrical connections from the amplifier 108 and other components in the ROSA to the conducting traces 402 of the flexible PCB are made more directly, Underneath the ROSA cover 501 mounted on the PCB are positioned plated through-hole vias 401 with land areas 502 inside the cover, said land areas being of sufficient size to allow bond wires 304 to be attached directly. It will be evident to one of ordinary skill in the art that this more direct means of connection will serve to reduce the number and scale of the characteristic impedance variations and discontinuities and parasitic impedances present in the signal paths and so allow improved high frequency performance. It will also be obvious that there is a cost saving in the reduced number of assembly steps involved in the manufacture of the ROSA.

FIG. 6 shows a further exemplar arrangement for an alternative form of ROSA construction that seeks to improve on some of the shortcomings of the previously described prior art according to some embodiments of the invention. In this arrangement, the top part of the cover 501 is mounted directly on the flexible PCB 201 with the lens 305 aligned over the photodiode 107 for optimum sensitivity. In order to make electrical connections between the internal components of the ROSA (e.g., 107, 108) and the conductive traces 402 of the PCB 201 the use of plated through-hole vias is avoided. Instead, holes 601 are cut in the insulating layer of the PCB 201, typically a polyimide material, so that suitably located areas 602 of the conductive traces (typically copper) on the back side of the PCB are now accessible, With a hole of sufficient size, it is now possible to connect a bond wire 304 directly from the amplifier 108 or other component within the ROSA to the corresponding conducting trace 402. In this way the characteristic impedance variations and discontinuities and parasitic impedances present in the signal paths will be further reduced and so allow improved high frequency performance to be achieved.

The holes 601 in the PCB 201 are obviously required to be of sufficient diameter to permit the bond wires leading from the amplifier and other components to be placed and secured on the conductive traces 402 on the back of the PCB. In practice, the diameter of said holes need not be excessively large, and in practice it is possible to place sufficient holes within the diameter of a conventional ROSA and still have ample space on the PCB surface within the ROSA cover to place the photodiode 107 correctly and to place the amplifier 108 as well as any necessary ancillary components.

The holes 601 may be formed by one of a number of common industrial processes. One particularly convenient method that is compatible with the manufacture of flexible PCB assemblies is to use an excimer ultra-violet laser to ablate and remove the insulating (typically polyimide) PCB material from within the boundaries of the required hole 601. An experimentally determined number of laser pulses may be used to remover the required depth of insulating material, and to ensure that the desired area 602 of the conducting trace 402 at the back of the PCB is fully exposed. The conductive traces, typically copper, will normally be insensitive to the intensity of the laser light used for the ablation and removal of the PCB insulating material and thus the completion stage of the formation of the connections hole is easily controlled in a volume manufacturing process.

To facilitate the connection of the bond wires 304 to the conductive traces on the rear of the PCB and also to any ground plane or other connections on the front side of the PCB it is common practice to use a selective gold or gold-palladium plating. This could be used to plate the conductive layer at the bottom of the access holes during the normal manufacturing stages of the PCB.

FIG. 7 shows a plan view of the exemplar arrangement shown previously in FIG. 6. In this plan view an example of a possible disposition of components is given, noting that some connections and ancillary components have been omitted for clarity. It will be clear that the photodiode 107 can be placed at the centre of the ROSA cover 501 and under the lens 305 for correct optical alignment. The amplifier 108 is connected to t e conductive traces 402 on the back of the PCB 201 by means of bond wires 304 that connect to said traces in the holes 601 cut through the PCB as explained above with reference to FIG. 6. In order for the conductive traces 402 to remain securely affixed to the back of the PCB during and after the wire bonding process, it is necessary to provide some mechanical support for the traces. To satisfy this requirement, one method of providing sufficient support is to make the ends of the traces 602 of a larger diameter than the holes 601 cut for the bond wires 304 so that the conductive trace 602 has support around the entire periphery of the hole 601. The layout of the traces from the holes to the edge of the flexible PCB may then be laid out in such a manner as to ensure that the characteristic impedance is maintained as close to the ideal desired value as possible.

FIG. 8 shows an exemplar method for the assembly of components according to some embodiments of the invention. It will be understood that many variations of this method and other different methods are possible to achieve the objectives of the invention.

Thus there is a first operation of fabricating one or more (for example a multiple of) ROSA PCBs on a rectangular panel with assembly alignment marks as shown in FIG. 8 by step 801.

Then the position of each ROSA PCB 201 is aligned in turn under laser stage as shown in FIG. 8 by step 802.

Then the centre of each ROSA PCB is marked with a laser to indicate the mounting position of photodiode as shown in FIG. 8 by step 803.

Then the holes for through-hole wire bonding are formed by ablating the PCB insulating material with a laser as shown in FIG. 8 by step 804.

Then the photodiode 107, transimpedance amplifier 108 and any other components are placed and affixed to the PCB with glue or by other suitable means as shown in FIG. 8 by step 805.

Next the photodiode, (transimpedance) amplifier and any other required components are electrically connected together by wire bonding as shown in FIG. 8 by step 806.

Then the (transimpedance) amplifier is electrically connected to the PCB traces 602 through the holes 601 and to other locations by wire bonding as shown in FIG. 8 by step 807.

Next, the cover 501 together with the associated lens 305 are aligned and fixed to the ROSA PCB, preferably in an inert atmosphere as shown in FIG. 8 by step 808.

Then the individual ROSA PCB items are separated from the panel (of multiple PCBs) as shown in FIG. 8 by step 809.

Lastly, the ROSA cover 501 with the associated lens 305 is assembled with the fibre alignment ferrule 204 as shown in FIG. 8 by step 810.

Whilst this invention has been described with reference to particular examples and possible embodiments thereof, these should not be interpreted as restricting the scope of the invention in any way. It is to be made clear that many other possible embodiments, modifications and improvements may be incorporated into or with the invention without departing from the scope and spirit of the invention as set out in the claims.

What is claimed is:

1. An assembly of electronic components providing means for the reception of data using an optical fibre wherein said assembly comprises:
    a photodiode;
    an amplifier coupled to said photodiode;
    a flexible printed circuit board, said photodiode and said amplifier physically mounted on said flexible printed circuit board;
    a cover, said cover configured to cover said photodiode and said amplifier, wherein said cover is physically attached to said flexible printed circuit board so as to provide mechanical rigidity around said photodiode and said amplifier, and said cover having an optically transparent aperture containing a lens configured to focus modulated light signals from a fibre onto said photodiode; and
    conductive bond wires configured to directly electrically couple said amplifier and said photodiode to conducting traces of said flexible printed circuit board.

2. The assembly as claimed in claim 1 wherein said assembly further comprises ancillary electronic components mounted on said flexible printed circuit board and covered by said cover.

3. The assembly as claimed in claim 1, wherein said cover comprises one of:
    a metal can structure; and
    a plastic can structure.

4. The assembly as claimed in claim 1, wherein said conducting traces of said flexible printed circuit board are located on a side opposite to a side of said flexible printed circuit board on which said photodiode and said amplifier are physically mounted.

5. The assembly as claimed in claim 4 wherein said holes provided to allow connection between said conductive traces and said amplifier and said photodiode within said covering are cut using one of:
    a laser; and
    an ultraviolet laser.

6. The assembly as claimed in claim 4, wherein said flexible printed circuit board is configured with at least one hole from one side of said flexible printed circuit board to an opposite side of said board, said at least one hole being located within a region of said flexible printed circuit board covered by said cover.

7. The assembly as claimed in claim 6, wherein regions of said conductive traces located under said at least one hole used for providing connection between said traces and said photodiode and said amplifier are made of larger diameter than said at least one hole.

8. The assembly as claimed in claim 7, wherein said regions of said conductive traces located under said at least one hole used for providing connection between said traces and said photodiode and said amplifier are made sufficiently large as to provide mechanical support for said traces in said region of said holes.

9. The assembly as claimed in claim 8 wherein a precious metal layer is used to coat areas inside said cover to which bonding wires will be attached to make electrical signal and power connections.

10. The assembly as claimed in claim 4, wherein connections between said conductive traces and said photodiode and said amplifier comprise at least one plated through hole and bonding contact areas within said cover.

11. The assembly as claimed in claim 1, wherein said conductive traces are laid out in a manner that minimises impedance variations and discontinuities in an electrical path between said electronic components and an edge of said flexible printed circuit board.

12. The assembly as claimed in claim 1, wherein said cover is attached to said printed circuit board by means of one of:
    a fixing agent;
    an adhesive; and
    solder.

13. A method of assembly of electronic components to provide a means for reception of data using an optical fibre, said method comprising:

providing a flexible printed circuit board;

physically mounting on flexible said printed circuit board a photodiode and an amplifier;

providing on said flexible printed circuit board at least one conductive trace from an edge of said flexible printed circuit board to at least one region of said board on which said amplifier and said photodiode are mounted;

providing on said flexible printed circuit board holes through said board configured to provide means of electrical connection between opposite sides of said flexible printed circuit board;

physically attaching a cover on said flexible printed circuit board and over said photodiode and said amplifier, said cover being configured to provide mechanical rigidity around said photodiode and said amplifier, and said cover having an optically transparent aperture containing a lens configured to focus modulated light signals from a fibre onto said photodiode; and coupling said amplifier and said photodiode to said at least one conducting trace of said flexible printed circuit board.

14. The method of assembly of electronic components as claimed in claim 13, wherein said cover is configured to cover ancillary electronic components mounted on said flexible printed circuit board.

15. The method of assembly of electronic components as claimed in claim 13, wherein said cover comprises one of:
a metal can structure; and
a plastic can structure.

16. The method of assembly of electronic components as claimed in claim 13, wherein said cover is attached to said flexible printed circuit board by means of one of:
a fixing agent;
an adhesive; and
solder.

17. The method of assembly of electronic components as claimed in claim 13, wherein said conductive traces are provided on a side of said flexible printed circuit board opposite to a side of said flexible printed circuit board whereon said photodiode and said amplifier are attached.

18. The method of assembly of electronic components as claimed in claim 13, wherein at least one said hole is provided within the region of said flexible printed circuit board covered by said cover.

19. The method of assembly of electronic components as claimed in claim 13, wherein said connections between said conductive traces and said photodiode and said amplifier are made by means of at least one plated through hole and bonding contact areas within said cover.

20. The method of assembly of electronic components as claimed in claim 13, wherein at least one electrical connection between the said traces and the said amplifier and said photodiode is made by providing at least one bond wire from a conductive trace through said at least one hole to an opposite side of said flexible printed circuit board.

* * * * *